United States Patent
Gutierrez-Aitken et al.

(10) Patent No.: US 6,528,829 B1
(45) Date of Patent: Mar. 4, 2003

(54) INTEGRATED CIRCUIT STRUCTURE HAVING A CHARGE INJECTION BARRIER

(75) Inventors: Augusto L. Gutierrez-Aitken, Redondo Beach, CA (US); Aaron K. Oki, Torrance, CA (US); Michael Wojtowicz, Long Beach, CA (US); Dwight C. Streit, Seal Beach, CA (US); Thomas R. Block, Los Angeles, CA (US); Frank M. Yamada, Palos Verdes Estates, CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/276,041

(22) Filed: Mar. 25, 1999

(51) Int. Cl.[7] ............................. H01L 29/70; H01S 3/19
(52) U.S. Cl. ....................... 257/200; 257/197; 257/194; 257/370; 257/591; 257/98; 257/88; 257/102; 257/94; 257/97
(58) Field of Search ................................. 257/194–200, 257/370, 591, 98, 88, 102, 94–99

(56) References Cited

U.S. PATENT DOCUMENTS

| | | | | |
|---|---|---|---|---|
| 4,644,553 A | * | 2/1987 | Von Ruyver et al. | 372/45 |
| 4,727,403 A | * | 2/1988 | Hida et al. | |
| 4,903,001 A | * | 2/1990 | Boba et al. | |
| 5,006,907 A | * | 4/1991 | Hayakawa | |
| 5,008,893 A | * | 4/1991 | Amann et al. | 372/50 |
| 5,041,882 A | * | 8/1991 | Katoh | |
| 5,053,356 A | * | 10/1991 | Mitsui et al. | |
| 5,055,893 A | * | 10/1991 | Sasagawa | |
| 5,321,253 A | * | 6/1994 | Gorfinkel et al. | 257/184 |
| 5,323,030 A | * | 6/1994 | Koscica et al. | 257/195 |
| 5,342,794 A | * | 8/1994 | Wei | 257/591 |
| 5,389,798 A | * | 2/1995 | Ochi et al. | 257/25 |
| 5,408,488 A | * | 4/1995 | Kurihara et al. | 372/46 |
| 5,410,159 A | * | 4/1995 | Sugawa et al. | 257/13 |
| 5,425,042 A | * | 6/1995 | Nido et al. | 375/45 |
| 5,585,309 A | * | 12/1996 | Mori et al. | |
| 5,614,734 A | * | 3/1997 | Guido | 257/94 |
| 5,621,750 A | * | 4/1997 | Iwano et al. | 438/32 |
| 5,818,863 A | * | 10/1998 | Nabet et al. | 372/46 |
| 5,848,086 A | * | 12/1998 | Lebby et al. | 372/46 |
| 5,895,929 A | * | 4/1999 | Abrokwah et al. | 257/20 |
| 5,987,048 A | * | 11/1999 | Ishikawa et al. | 257/94 |
| 6,005,263 A | * | 12/1999 | Saito et al. | 257/200 |
| 6,040,590 A | * | 3/2000 | O'Brien et al. | 257/94 |
| 6,054,726 A | * | 4/2000 | Ogihara et al. | 252/98 |

* cited by examiner

Primary Examiner—Alexander O. Williams

(57) ABSTRACT

The invention relates to an integrated circuit structure that includes a substrate wafer having an active device layer disposed on a surface of the substrate wafer and having an electrically conductive element contained therein. The integrated circuit structure further comprises a barrier disposed between the substrate wafer and the active device layer, where the barrier blocks carriers injected into the substrate wafer and reduces low frequency oscillation effect.

8 Claims, 3 Drawing Sheets

INTEGRATED CIRCUIT STRUCTURE HAVING A CHARGE INJECTION BARRIER

BACKGROUND OF THE INVENTION

1. Field of the Invention

The present invention relates generally to semiconductor circuit structures and, more specifically to a structure that reduces the low frequency oscillations created by the injection of carriers into the semiconductor structure.

2. Description of the Prior Art

Low frequency oscillations are produced when a charge is injected into a semi-insulating substrate. The low frequency oscillations, when viewed with a spectrum analyzer, appear as single or multiple relatively broad peaks or as broad noise in a frequency range of a few hertz (Hz) to a few kilohertz (KHz). In high dynamic range or high gain circuits, these low frequency oscillations are mixed and amplified and appear as increased noise at the output of a circuit, degrading the overall performance of the semiconductor system. The increased noise can manifest itself as anomalous phase noise, spurious sidebands, or peaks superimposed on the expected 1/f noise. All of these manifestations may critically limit the performance of the circuits and create a significant source of noise in monolithic microwave integrated circuits (MMICs).

The mechanism believed to be responsible for the low frequency oscillations is the field-enhanced capture of carriers by deep level traps. As illustrated in the prior art structure of FIG. 1, the trapping of carriers 16 with increasing electric field produces a negative differential resistance and the formation of a high field domain traveling from an electron injecting contact 18 towards a second contact 22. Low frequency oscillations 24 are produced within the high field domain between the contacts 18 and 22. The frequency of the low frequency oscillations 24 is determined by the transit time of the high field domain between the two contacts (18, 22). The threshold, frequency and amplitude of the low frequency oscillations typically depend on substrate type, substrate surface polishing, electric field voltage applied between contacts or devices, distance between contacts (carrier diffusion length), substrate temperature, and carrier density injected into a substrate. Conventional semiconductor device systems attempt to reduce the low frequency oscillation effect in several ways.

The publication "Low Frequency Oscillations In GaAs IC's", by Miller et al., IEEE Tech. Digest GaAs IC Symposium, pp. 31–34, 1985 discloses reducing low-frequency oscillation effect by using several techniques that decrease or eliminate the deep level traps that capture and release low-frequency oscillation producing electrons. One such technique describes changing the integrated circuit design. This technique includes designing a circuit that minimizes the electrical field near critical devices or contacts pads and changing the layout of a circuit to reduce the coupling of oscillating leakage currents to active devices and contact pads. This technique may reduce the low frequency oscillations but does not guarantee the complete suppression of the oscillations. Additionally, this technique is circuit dependent and does not represent a general solution.

In the Miller publication, alternate methods for reducing or eliminating deep level traps to minimize low frequency oscillations are also proposed. Specifically, one method suggests choosing substrate materials such as highly chromium (Cr) doped LEC and horizontal Bridgeman gallium arsenide (GaAs) that have a reduced tendency for low frequency oscillation. A variation on this method, proposed by Miller et al., is to grow a thick (approximately 10 $\mu$m) OM-VPE GaAs buffer on the substrate before growing the active device structure.

Finally, in conventional systems, the substrate wafer surface may be selectively cleaned prior to growing the active device epilayers in an attempt to reduce low frequency oscillation effects. However, the results derived from selective cleaning processes are unpredictable and are not comprehensive.

Based on techniques known in the art for semiconductor device systems, a semiconductor device structure that reduces the effects of low frequency oscillations resulting from carrier injection is highly desirable.

SUMMARY OF THE INVENTION

The present invention provides an integrated circuit structure that includes a substrate wafer having an active device layer disposed on a surface of the substrate wafer and having an electrically conductive element contained therein. The integrated circuit structure further comprises a barrier disposed between the substrate wafer and the active device layer, where the barrier blocks carriers injected into the substrate wafer and reduces low frequency oscillation effect.

BRIEF DESCRIPTION OF THE DRAWINGS

Reference is now made to the following description and attached drawings, wherein.

DETAILED DESCRIPTION OF THE INVENTION

Figure 2:
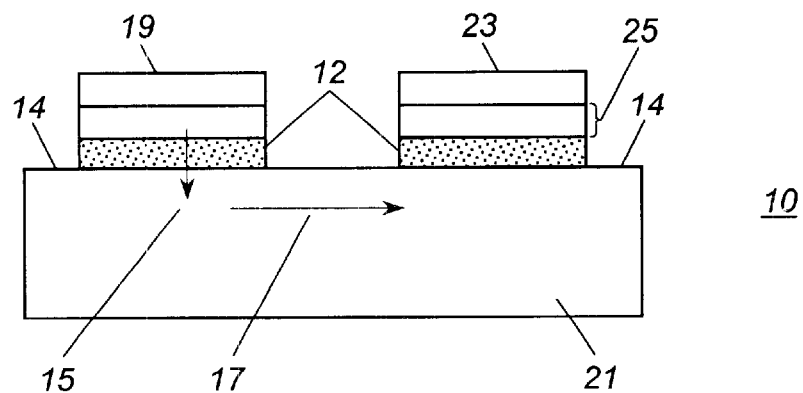
FIG. 2 is a side cross-sectional view illustrating an integrated circuit structure having a substrate-epilayer interface barrier.

Referring to FIG. 2, the present invention discloses a p-n junction barrier 12 formed with a wide gap material at an interface 14 between epilayers 25 and a substrate wafer 21.

The p-n junction 12 acts as a barrier and reduces the injection of carriers 15 from a contact pad 19 or similarly electrically conductive element into the substrate wafer 21. By reducing the carrier injection, there is not enough charge to form or maintain high field domains between the contact pad 19 and a contact pad 23 and low-frequency oscillations are reduced or eliminated. For the purposes of the preferred embodiment, the charge injection barriers described here apply to any circuit element that has a highly doped layer (n-type or p-type) as the first layer in contact with the substrate. It is important to note that the barrier profiles described here are fabricated for highly doped n-type first layers, however, to accommodate a p-type first layer, the polarities of the dopants in the barrier would be changed to an opposite polarity (e.g. n-type to p-type or p-type to n-type). Additionally, the disclosed charge injection barriers can be used for any heterojunction bipolar transistor (HBT) or for other circuit elements that are fabricated directly on top of a highly doped layer in contact with a substrate (e.g. capacitors, bonding pads).

Figure 3:
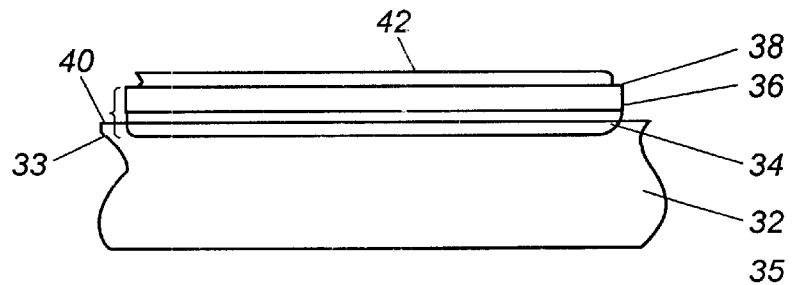
FIG. 3 is a side cross-sectional view illustrating an integrated circuit structure having a first barrier profile in accordance with the present invention.

Referring to FIG. 3, a first barrier profile of the type previously mentioned is fabricated for a gallium arsenide (GaAs) HBT device 35 where a p-n junction barrier 33 is formed from $p^+$ aluminum gallium arsenide ($Al_{0.3}Ga_{0.7}As$), a wider gap material, chosen to increase the barrier height. Specifically, as illustrated in Table 1, the first barrier profile comprises the wide gap AlGaAs (30%) $p^+$ layer 34 having a thickness of from approximately 80 angstrom (Å) to 120 Å and a $p^+$ doping of from approximately $1 \times 10^{18}$ to $4 \times 10^{18}$ atoms (dopants) per cubic centimeter; a graded layer 36 with a smooth composition transition from AlGaAs to GaAs having a thickness of from approximately

TABLE 1

| Barrier Profile | | |
|---|---|---|
| Thickness | Material | Doping |
| | GaAs/AlGaAs HBT | |
| | GaAs | $n^+ 1 \times 10^{18} - n^+ 4 \times 10^{18}$ |
| 250 Å–300 Å | AlGaAs -> GaAs | $n^- 6 \times 10^{15} - n^- 9 \times 10^{15}$ |
| 80 Å–120 Å | AlGaAs (30%) | $p^+ 1 \times 10^{18} - p^+ 4 \times 10^{18}$ |
| | GaAs Substrate | Semi-insulating |

250 Å to 300 Å and a $n^-$ doping of from approximately $6 \times 10^{15}$ to $9 \times 10^{15}$ atoms per cubic centimeter; and a GaAs device subcollector layer 38 having a $n^+$ doping of from approximately $1 \times 10^{18}$ to $4 \times 10^{18}$ atoms per cubic centimeter. Referring to FIG. 3, the HBT structure 35 contains the barrier 33 where the $p^+$ layer 34 is deposited on the surface 40 of the semi-insulating GaAs substrate 32, the graded layer 36 is deposited on the surface of the $p^-$ layer 34, and the device subcollector layer 38 is deposited on the surface of the graded layer 36, whereby the graded layer 36 is disposed between the $p^+$ layer 34 and the device subcollector layer 38. Finally, the remaining HBT structure 42 is fabricated on the surface of the device subcollector layer 38 from materials comprising GaAs and AlGaAs.

Figure 4:
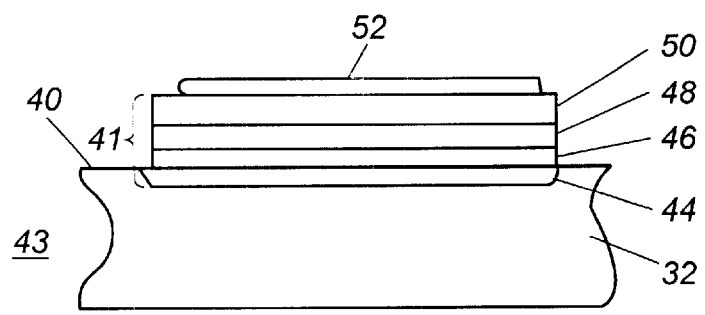
FIG. 4 is a side cross-sectional view illustrating an integrated circuit structure having a second alternate barrier profile in accordance with the present invention.

Alternatively, FIG. 4 illustrates a variation of the first barrier profile where a buffer layer 44 is added to increase the height of the barrier 41. By increasing the barrier height, the energy gap that injected electrons must jump is increased and low frequency oscillations reduced. As illustrated in Table 2, this alternate second

TABLE 2

| Barrier Profile | | |
|---|---|---|
| Thickness | Material | Doping |
| | GaAs/AlGaAs HBT | |
| | GaAs | $n^+ 1 \times 10^{18} - n^+ 4 \times 10^{18}$ |
| 250 Å–350 Å | AlGaAs -> GaAs | $n^- 6 \times 10^{15} - n^- 9 \times 10^{15}$ |
| 80 Å–120 Å | AlGaAs (30%) | $p^+ 1 \times 10^{18} - p^+ 4 \times 10^{18}$ |
| 150 Å–250 Å | GaAs | Undoped |
| | GaAs Substrate | Semi-insulating | barrier profile comprises an undoped GaAs buffer layer 44 having a thickness of from approximately 150 Å to 250 Å; a wide gap AlGaAs (30%) $p^+$ layer 46 having a thickness of from approximately 80 Å to 120 Å and a $p^+$ doping of from approximately $1 \times 10^{18}$ to $4 \times 10^{18}$ atoms per cubic centimeter; a graded layer 48 with a smooth composition transition from AlGaAs to GaAs having a thickness of from approximately 250 Å to 350 Å and a $n^-$ doping of from approximately $6 \times 10^{15}$ to $9 \times 10^{15}$ atoms per cubic centimeter; and a GaAs device subcollector layer 50 having a $n^+$ doping of from approximately $1 \times 10^{18}$ to $4 \times 10^{18}$ atoms per cubic centimeter. Referring to FIG. 4, the HBT structure 43 contains the barrier 41 where the buffer layer 44 is deposited on a surface 40 of the semi-insulating GaAs substrate 32, the $p^+$ layer 46 is deposited on the surface of the buffer layer 44, the graded layer 48 is deposited on the surface of the $p^+$ layer 46, and the device subcollector layer 50 is deposited on the surface of the graded layer 48, whereby the buffer layer 44 is disposed between the substrate 32 and $p^+$ layer 46, and the graded layer 48 is disposed between the $p^+$ layer 46 and the device subcollector layer 50. Similar to the HBT structure previously described, the remaining HBT structure 52 is fabricated on the surface of the device subcollector layer 50 from materials comprising GaAs and AlGaAs.

Figure 5:
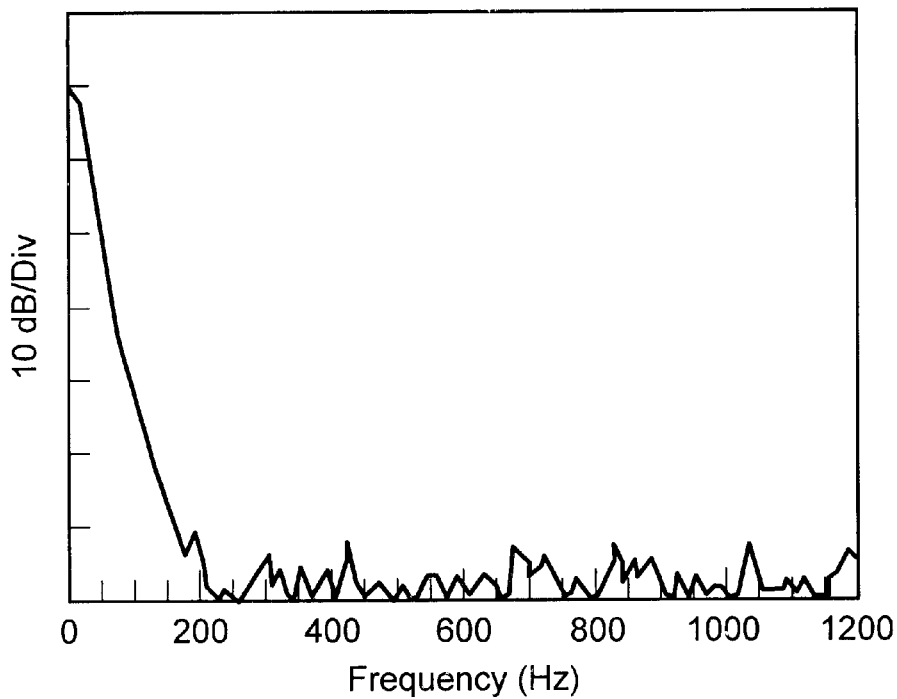
FIG. 5 is a graphical illustration of low frequency oscillation measurements for the FIG. 3 and FIG. 4 barrier profiles in accordance with the present invention.
Figure 6:
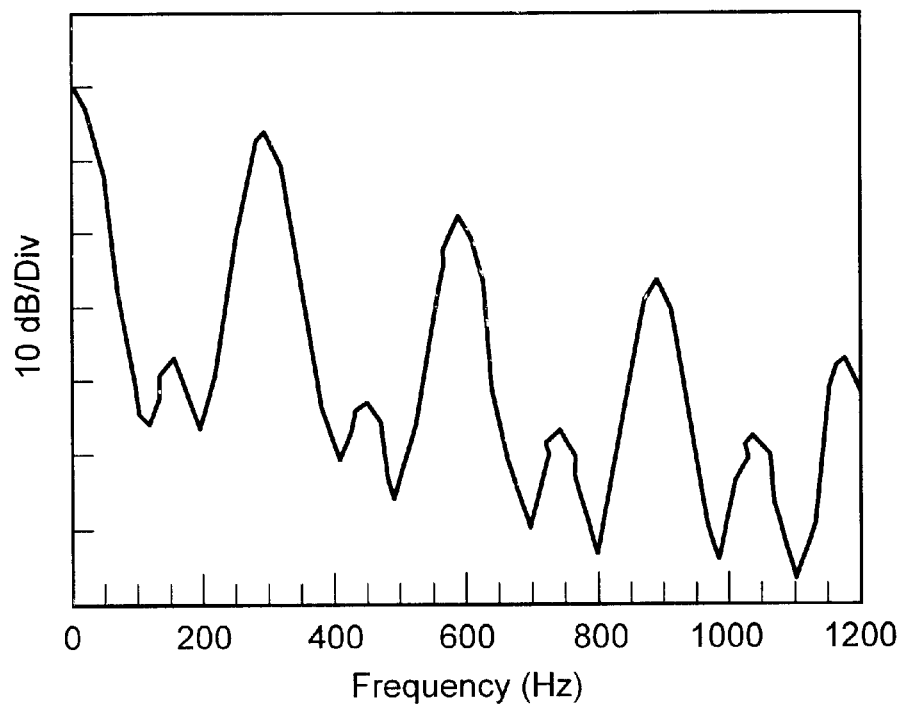
FIG. 6 is a graphical illustration of low frequency oscillation measurements for a prior art integrated circuit structure having no barrier.

Substrate wafers having the profiles described in FIGS. 3 and 4 were tested for low frequency oscillations with a spectrum analyzer and compared to similar wafers without barriers. The tests were performed at a wafer temperature of 80° C. in the frequency range of from 0 to 1200 Hz where 40 volts (V) of bias was applied between two adjacent contact pads. FIG. 5 illustrates the spectrum analyzer trace results for wafers with the barrier profiles described in FIGS. 3 and 4. The trace shows only the noise floor of the measuring equipment and a total absence of low frequency oscillation. Moreover, none of the wafers tested with the barrier showed frequency oscillations. In contrast, FIG. 6 is a typical trace result for wafers without barriers at the same bias voltage showing multiple low frequency oscillation peaks. A general comparison between FIGS. 5 and 6 demonstrates that the barrier is alleviating the low frequency oscillation.

Figure 1:
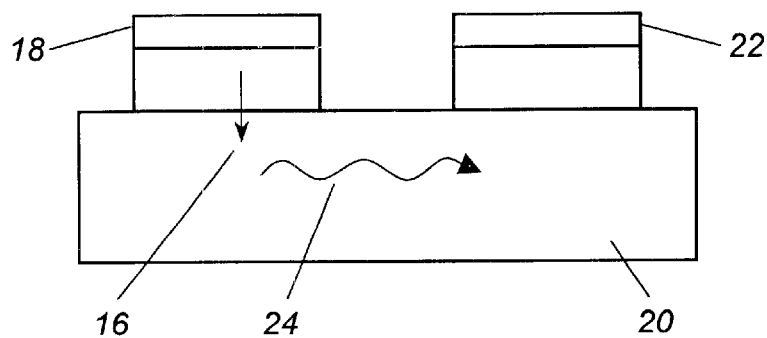
FIG. 1 is an illustration of a prior art integrated circuit structure having no substrate-epilayer interface barrier.
Figure 7A:
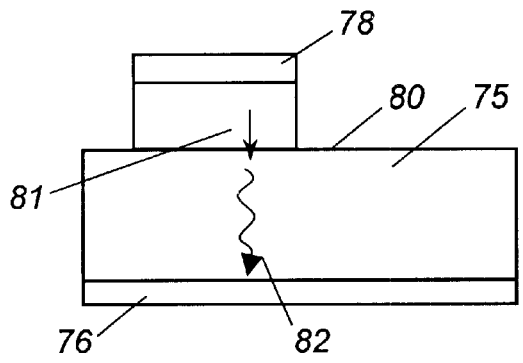
FIG. 7a is a side cross-sectional view of a prior art integrated circuit structure having carriers injected from a contact pad at top surface of a substrate wafer.
Figure 7B:
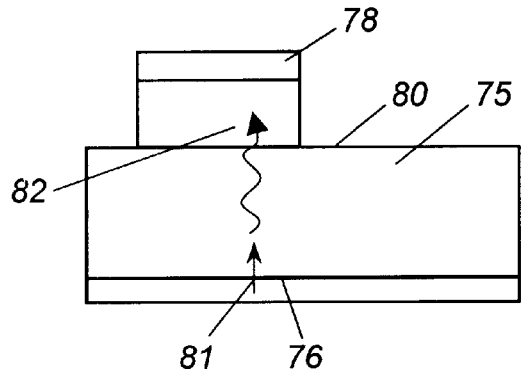
FIG. 7b is a side cross-sectional view of a prior art integrated circuit structure having carriers injected from a back surface of a substrate wafer to a contact pad at top surface of the substrate wafer.

As previously illustrated in FIG. 1, low frequency oscillations 24 are created when carriers 15 are injected from contacts (18, 22) at the top surface of the substrate wafer 20. However, low frequency oscillations may also occur when carriers are injected at the back surface of a substrate wafer. Many substrate wafers typically have a metallic back surface and, as shown in FIG. 7a, when the back metal surface 76 is positive with respect to the contact pad 78 on the top surface 80 of the substrate wafer 75, electrons 81 injected from the pad 78 into the substrate 75 create low frequency oscillations 82. The profiles previously described in FIGS. 3 and 4 present very high barriers for this type of carrier injection where electrons move from a contact pad into a substrate. However, as illustrated in FIG. 7b, if the back metal 76 is negative with respect to the contact pad 78, electrons 81 injected from the back metal surface 76 into the substrate 75 reach the contact pad 78 and create low frequency oscillations 82. While the profiles described by FIGS. 3 and 4 provide barriers for electrons injected at the back surface of the substrate wafer, the barriers are lower than that provided when electrons are injected at the top surface of the substrate wafer. To mitigate carrier injection into a substrate from either direction, a third barrier profile may be used.

Figure 8:
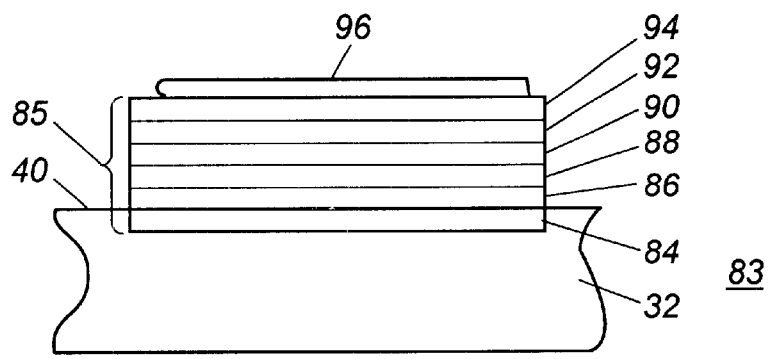
FIG. 8 is a side cross-sectional view illustrating an integrated circuit structure having a third alternate barrier profile in accordance with the present invention.

Referring to FIG. 8, the third barrier profile is fabricated within a GaAs HBT structure 83 and contains a p-n junction barrier 85 formed from a wide gap $p^+$ $Al_{0.3}Ga_{0.7}As$ material. Specifically, and as illustrated in Table 3, the third barrier profile includes an undoped GaAs buffer layer 84 having a thickness of from approximately 150 Å to 200 Å; a GaAs $n^+$ layer 86 having a thickness of from approximately 150 Å to 250 Å and a $n^+$ doping of from approximately $1 \times 10_{18}$ to $4 \times 10^{18}$ atoms per cubic centimeter; a GaAs spacer layer 88 having a thickness of from approximately 80 Å to 120 Å and a n doping of from approximately $6 \times 10^{15}$ to $9 \times 10^{15}$ atoms per cubic centimeter; a wide gap AlGaAs (30%) $p^+$ layer 90 having a thickness of from approximately 150 Å to 250 Å and a $p^+$ doping of from approximately $1 \times 10^{18}$ to $4 \times 10^{18}$ atoms per cubic centimeter; a graded layer 92 with a smooth composition transition from AlGaAs to GaAs having a thickness of from approximately 250 Å to 350 Å and a n doping of from approximately $6 \times 10^{15}$ to $9 \times 10^{15}$ atoms per cubic centimeter; and a GaAs device subcollector layer 94 having a $n^+$ doping of from approximately $1 \times 10^{18}$ to $4 \times 10^{18}$ atoms per cubic centimeter. Referring to FIG. 8,

TABLE 3

| | Barrier Profile | |
|---|---|---|
| Thickness | Material | Doping |
| | GaAs/AlGaAs HBT | |
| | GaAs | $n^+$ 1 × $10^{18}$–$n^+$ 4 × $10^{18}$ |
| 250 Å–350 Å | AlGaAs -> GaAs | $n^-$ 6 × $10^{15}$–$n^-$ 9 × $10^{15}$ |
| 150 Å–250 Å | AlGaAs (30%) | $p^+$ 1 × $10^{18}$–$p^+$ 4 × $10^{18}$ |
| 80 Å–120 Å | GaAs | $n^-$ 6 × $10^{15}$–$n^-$ 9 × $10^{15}$ |
| 150 Å–250 Å | GaAs | $n^+$ 1 × $10^{18}$–$n^+$ 4 × $10^{18}$ |
| 150 Å–200 Å | GaAs | Undoped |
| | GaAs Substrate | Semi-insulating |

As illustrated in FIG. 8, the HBT structure 83 contains the barrier 85 where the buffer layer 84 is deposited on the surface 40 of the semi-insulating GaAs substrate 32, the $n^+$ layer 86 is deposited on the surface of the buffer layer 84, the spacer layer 88 is deposited on the surface of the $n^+$ layer 86, the $p^+$ layer 90 is deposited on a surface of the spacer layer 88, the graded layer 92 is deposited on a surface of the $p^+$ layer 90, and the device subcollector layer 94 is deposited on a surface of the graded layer 92, whereby the buffer layer 84 is disposed between the substrate 32 and $n^+$ layer 86, the $n^+$ layer 86 is disposed between the buffer layer 84 and the spacer layer 88, the spacer layer 88 is disposed between the $n^+$ layer 86 and the $p^+$ layer 90, the $p^+$ layer 90 is disposed between the spacer layer 88 and the graded layer 92, and the graded layer 92 is disposed between the $p^+$ layer 90 and the device subcollector layer 94. Similar to previous profiles, the remaining HBT structure 96 is fabricated on the surface of the device subcollector layer 94 from materials comprising GaAs and AlGaAs.

Figure 9:
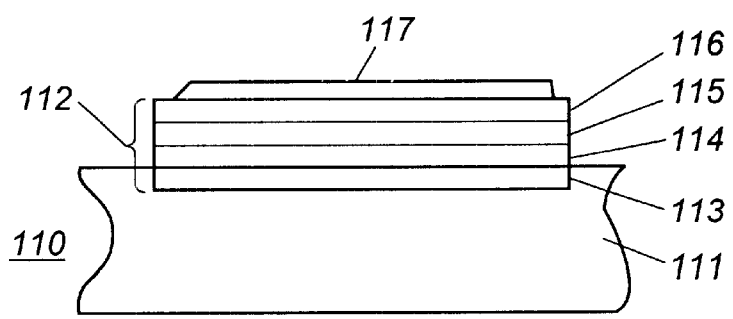
FIG. 9 is a side cross-sectional view illustrating an integrated circuit structure having a fourth alternate barrier profile in accordance with the present invention.

In addition to providing barriers for varied types of carrier injection, it is desirable to create barriers that may accommodate different types of III-V semiconductor materials like gallium arsenide (GaAs), gallium phosphide (GaP), indium phosphide (InP), and indium arsenide (InAs). FIG. 9 illustrates an alternative barrier profile for indium phosphide (InP) based HBT devices where indium aluminum arsenide (InAlAs) and indium gallium arsenide (InGaAs) are lattice matched to an InP substrate 111. As illustrated in Table 4, this alternate barrier profile contains an undoped InAlAs buffer layer 113 having a thickness of from approximately 150 Å to 250 Å; an InAlAs $p^+$ layer 114 having a thickness of from approximately 80 Å to 120 Å and a $p^+$ doping of from approximately $1 \times 10^{18}$ to $4 \times 10^{18}$ atoms per cubic centimeter; a graded layer 115 with a smooth composition transition from InAlAs to InGaAs having a thickness of from approximately 250 Å to 350 Å and a $n^-$ doping of from approximately $6 \times 10^{15}$ to $9 \times 10^{15}$ atoms per cubic centimeter; and a InGaAs device subcollector layer 116 having a $n^+$ doping of from approximately $1 \times 10^{18}$ to $4 \times 10^{18}$ atoms per cubic centimeter.

TABLE 4

| | Barrier Profile | |
|---|---|---|
| Thickness | Material | Doping |
| | InGaAs/InAlAs HBT | |
| | InGaAs | $n^+$ 1 × $10^{18}$–$n^+$ 4 × $10^{18}$ |
| 250 Å–350 Å | InAlAs -> InGaAs | $n^-$ 6 × $10^{15}$–$n^-$ 9 × $10^{15}$ |
| 80 Å–120 Å | InAlAs | $p^+$ 1 × $10^{18}$–$p^+$ 4 × $10^{18}$ |
| 150 Å–250 Å | InAlAs | Undoped |
| | InP Substrate | Semi-insulating |

Referring to FIG. 9, the HBT structure 110 contains the barrier 118 having the buffer layer 113 deposited on the surface 112 of the semi-insulating InP substrate 111, the $p^+$ layer 114 deposited on the surface of the buffer layer 113, the graded layer 115 deposited on the surface of the $p^+$ layer 114, and the device subcollector layer 116 deposited on the surface of the graded layer 115. The buffer layer 113 is disposed between the substrate 111 and $p^+$ layer 112, and the graded layer 115 is disposed between the $p^+$ layer 114 and the device subcollector layer 116. Finally, the remaining HBT structure 117 is fabricated on the surface of the device subcollector layer 116 from materials comprising InGaAs and InAlAs.

High gain and high dynamic range semiconductor integrated circuits for very low noise systems are widely used across industrial and commercial applications. Therefore, the barrier technique disclosed in the present invention has many advantages related to the reduction of low frequency oscillations. First, the present invention works for any circuit design and in a wide range of bias voltages. Second, it is independent of substrate type and substrate cleaning processes or preparation prior to epitaxial device layer growth. Finally, it involves only a short increase in growth time and does not require any change in the standard wafer fabrication process. Additionally, the charge injection barrier has the advantage of reducing the leakage current between devices or contact pads and significantly increases the uniformity of the leakage current. Furthermore, this charge barrier decreases the effect of ionizing radiation.

Obviously, many modifications and variations of the present invention are possible in light of the above teachings. Thus, it is to be understood that, within the scope of the appended claims, the invention may be practiced otherwise than as specifically described above.

What is claimed is:

1. An integrated circuit structure, comprising:
   a substrate having a surface;
   a barrier disposed on the substrate surface for blocking carriers injected into the substrate from an electrically conductive element, wherein the barrier comprises a plurality of doped semiconductor layers formed on the substrate surface; and a heterojunction bipolar transistor (HBT) device disposed on and in immediate contact with the barrier, wherein the HBT device has the electrically conductive element coupled thereto.

2. An integrated circuit structure as defined in claim 1, wherein the substrate is a Group III-V semiconductor material selected from the group consisting of gallium arsenide (GaAs), gallium phosphide (GaP), indium phosphide (InP), and indium arsenide (InAs).

3. An integrated circuit structure as defined in claim 1, wherein the substrate is a semi-insulating semiconductor material.

4. An integrated circuit structure as defined in claim 1, wherein the electrically conductive element is an electron injecting contact.

5. An integrated circuit structure as defined in claim 1, wherein the barrier doped semiconductor layers include:

a first layer of doped aluminum gallium arsenide (AlGaAs) formed over the substrate surface; and a graded layer formed over the first layer, oppositely doped to the first layer and having a smooth composition transition from AlGaAs to gallium arsenide (GaAs).

6. An integrated circuit structure as defined in claim 1, wherein the barrier doped semiconductor layers include:

a first layer of undoped gallium arsenide (GaAs) formed over the substrate surface;

a second layer of doped aluminum gallium arsenide (AlGaAs) formed over the first layer; and a graded layer formed over the second layer, oppositely doped to the second layer and having a smooth composition transition from AlGaAs to GaAs.

7. An integrated circuit structure as defined in claim 1, wherein the barrier doped semiconductor layers include:

a first layer of undoped gallium arsenide (GaAs) formed over the substrate surface;

second and third successive layers of doped GaAs formed over the first layer;

a fourth layer of doped aluminum gallium arsenide (AlGaAs) formed over the third layer and oppositely doped to the second and third layers; and a graded layer formed over the fourth layer, oppositely doped to the fourth layer and having a smooth composition transition from AlGaAs to GaAs.

8. An integrated circuit structure as defined in claim 1, wherein the barrier doped semiconductor layers include:

a first layer of undoped indium aluminum arsenide (InAlAs) formed over the substrate surface;

a second layer of doped InAlAs) formed over the first layer; and a graded layer formed over the second layer, oppositely doped to the second layer and having a smooth composition transition from InAlAs to indium gallium arsenide (InGaAs).

* * * * *